(12) United States Patent
Pautsch et al.

(10) Patent No.: US 8,218,320 B2
(45) Date of Patent: Jul. 10, 2012

(54) HEAT SINKS WITH C-SHAPED MANIFOLDS AND MILLICHANNEL COOLING

(75) Inventors: Adam Gregory Pautsch, Rexford, NY (US); Satish Sivarama Gunturi, Albany, NY (US); Patrick Jose Lazatin, Glenville, NY (US)

(73) Assignee: General Electric Company, Niskayuna, NY (US)

( * ) Notice: Subject to any disclaimer, the term of this patent is extended or adjusted under 35 U.S.C. 154(b) by 198 days.

(21) Appl. No.: 12/826,016

(22) Filed: Jun. 29, 2010

(65) Prior Publication Data

US 2011/0317368 A1 Dec. 29, 2011

(51) Int. Cl.
*H05K 7/20* (2006.01)
*F28F 7/00* (2006.01)
*H01L 23/34* (2006.01)

(52) U.S. Cl. ....... 361/699; 165/80.2; 165/80.4; 257/714
(58) Field of Classification Search .................... 361/699
See application file for complete search history.

(56) References Cited

U.S. PATENT DOCUMENTS

| | | | |
|---|---|---|---|
| 4,010,489 A | 3/1977 | Bourbeau et al. | |
| 4,029,141 A | 6/1977 | Ferrari et al. | |
| 4,313,128 A | 1/1982 | Schlegel et al. | |
| 4,392,153 A | 7/1983 | Glascock, II et al. | |
| 4,559,580 A | 12/1985 | Lutfy | |
| 4,614,227 A | 9/1986 | Vogel | |
| 5,006,921 A | 4/1991 | Ishizuka et al. | |
| 5,161,089 A * | 11/1992 | Chu et al. | 361/703 |

(Continued)

FOREIGN PATENT DOCUMENTS

EP 0989611 B1 3/2000

(Continued)

OTHER PUBLICATIONS

R. S. Zhang et al., "Advanced and Integrated Cooling for Press-Packages," U.S. Appl. No. 12/193,429, filed Aug. 18, 2008.

(Continued)

*Primary Examiner* — Gregory Thompson
(74) *Attorney, Agent, or Firm* — Penny A. Clarke (57) ABSTRACT

A heat sink for cooling at least one electronic device package includes a lower lid, an upper lid, and a body formed of at least one thermally conductive material. The body is disposed between and sealed to the lower and upper lids and defines a tapered inlet distribution chamber configured to receive a coolant, C-shaped inlet manifolds configured to receive the coolant from the tapered inlet distribution chamber, inverted C-shaped outlet manifolds configured to exhaust the coolant. The inlet and outlet manifolds are interleaved and disposed in a circular arrangement. The outlet manifolds extend around only a portion of the body and terminate adjacent to opposing sides of the inlet chamber. The body further defines a tapered outlet chamber configured to receive the coolant from the outlet manifolds, where the inlet manifolds extend around only a portion of the body and terminate adjacent to opposing sides of the tapered outlet chamber. Millichannels are formed in the body or are formed in at least one of the lids and are configured to receive the coolant from the inlet manifolds and to deliver the coolant to the outlet manifolds. The millichannels are disposed in a radial arrangement, and the millichannels and the inlet and outlet manifolds are further configured to cool one of the upper and lower contact surfaces of the electronic device package. A lidless heat sink is also provided.

27 Claims, 8 Drawing Sheets

U.S. PATENT DOCUMENTS

| | | | |
|---|---|---|---|
| 5,221,851 A | 6/1993 | Gobrecht et al. | |
| 5,423,376 A | 6/1995 | Julien et al. | |
| 5,495,889 A | 3/1996 | Dubelloy | |
| 5,705,853 A | 1/1998 | Faller et al. | |
| 5,727,618 A | 3/1998 | Mundinger et al. | |
| 5,978,220 A | 11/1999 | Frey et al. | |
| 6,014,312 A | 1/2000 | Schulz-Harder et al. | |
| 6,101,715 A | 8/2000 | Fuesser et al. | |
| 6,388,317 B1 | 5/2002 | Reese | |
| 6,473,303 B2 | 10/2002 | Kaufmann | |
| 6,536,516 B2 | 3/2003 | Davies et al. | |
| 6,738,258 B2 | 5/2004 | Bijlenga et al. | |
| 6,921,969 B2 | 7/2005 | Knapp | |
| 7,061,104 B2 | 6/2006 | Kenny, Jr. et al. | |
| 7,139,172 B2 | 11/2006 | Bezama et al. | |
| 7,156,159 B2 * | 1/2007 | Lovette et al. | 165/104.33 |
| 7,185,697 B2 | 3/2007 | Goodson et al. | |
| 7,327,024 B2 | 2/2008 | Stevanovic et al. | |
| 7,331,378 B2 | 2/2008 | Bhatti et al. | |
| 7,353,859 B2 | 4/2008 | Stevanovic et al. | |
| 7,414,843 B2 | 8/2008 | Joshi et al. | |
| 7,460,369 B1 | 12/2008 | Blish, II | |
| 7,569,426 B2 * | 8/2009 | Myers et al. | 438/122 |
| 7,817,422 B2 * | 10/2010 | Gunturi et al. | 361/699 |
| 8,115,302 B2 * | 2/2012 | Andry et al. | 257/713 |
| 2004/0190251 A1 | 9/2004 | Prasher et al. | |
| 2005/0168949 A1 * | 8/2005 | Tilton et al. | 361/699 |
| 2006/0144565 A1 | 7/2006 | Tsai et al. | |
| 2007/0215325 A1 * | 9/2007 | Solovitz et al. | 165/80.4 |
| 2007/0295482 A1 | 12/2007 | Fitzgerald et al. | |
| 2010/0038058 A1 | 2/2010 | Gunturi et al. | |
| 2010/0302733 A1 * | 12/2010 | Woody et al. | 361/699 |

FOREIGN PATENT DOCUMENTS

| | | |
|---|---|---|
| WO | 0195688 A1 | 12/2001 |
| WO | 02097883 A1 | 12/2002 |

OTHER PUBLICATIONS

EP 09176561 Search Report, Mar. 29, 2010.
"Semiconductor Cooler," Anonymous, Mason Publications, ISSN: 0374-4353, vol. 324, No. 40, Apr. 1, 1991.
Office Action, U.S. Appl. No. 12/193,429, May 3, 2010.
Office Action for U.S. Appl. No. 12/826,128, dated Jan. 6, 2012.

* cited by examiner

HEAT SINKS WITH C-SHAPED MANIFOLDS AND MILLICHANNEL COOLING

BACKGROUND

The invention relates generally to power electronics and, more particularly, to advanced cooling for power electronics.

High power converters, such as medium voltage industrial drives, frequency converters for oil and gas, traction drives, Flexible AC Transmission (FACT) devices, and other high power conversion equipment, for example rectifiers and inverters, typically include press-pack power devices with liquid cooling. Non-limiting examples of power devices include integrated gate commutated thyristors (IGCTs), diodes, insulated gate bipolar transistors (IGBTs), thyristors and gate turn-off thyristors (GTOs). Press-pack devices are particularly advantageous in high power applications, and benefits of press-packs include double-sided cooling, as well as the absence of a plasma explosion event during failure.

To construct a high power converter circuit using press-pack devices, heat sinks and press-pack devices are typically sandwiched to form a stack. State-of-the-art power converter stacks typically employ conventional liquid cooled heat sinks with larger diameter cooling channels. In certain applications, thermal grease layers are disposed between respective ones of the press-pack device and the conventional liquid cooled heat sink. In other applications, at least some of the layers are simply held together by pressure, with no thermal grease in between them. This arrangement results in significant thermal contact resistance.

It would be desirable to provide improved heat sink designs which prevent the coolant from leaking onto the electronics during assembly, disassembly, or servicing. It would further be desirable to provide improved heat sink designs that enable the use of heat spreading effects for enhanced cooling of power electronics. In addition, improved heat sink designs with lower manufacturing costs and enhanced heat transfer are also desired.

BRIEF DESCRIPTION

One aspect of the present invention resides in a heat sink for cooling at least one electronic device package. The electronic device package has an upper contact surface and a lower contact surface. The heat sink includes a lower lid, an upper lid, and a body formed of at least one thermally conductive material. The body is disposed between and sealed to the lower and upper lids and defines a tapered inlet distribution chamber configured to receive a coolant, a number of C-shaped inlet manifolds configured to receive the coolant from the tapered inlet distribution chamber, and a number of inverted C-shaped outlet manifolds configured to exhaust the coolant. The C-shaped inlet and inverted C-shaped outlet manifolds are interleaved and are disposed in a circular arrangement, and the inverted C-shaped outlet manifolds extend around only a portion of the body and terminate adjacent to opposing sides of the tapered inlet chamber. The body further defines a tapered outlet chamber configured to receive the coolant from the inverted C-shaped outlet manifolds. The C-shaped inlet manifolds extend around only a portion of the body and terminate adjacent to opposing sides of the tapered outlet chamber. Millichannels are formed in the body or are formed in at least one of the lower and upper lids and are configured to receive the coolant from the C-shaped inlet manifolds and to deliver the coolant to the inverted C-shaped outlet manifolds. The millichannels are disposed in a radial arrangement, and the millichannels and the C-shaped inlet and inverted C-shaped outlet manifolds are further configured to cool one of the upper and lower contact surfaces of the electronic device package.

Another aspect of the invention resides in a heat sink for cooling an electronic device package. The heat sink includes a lid and a body formed of at least one thermally conductive material. The body is sealed to the lid and defines a tapered inlet distribution chamber configured to receive a coolant, a number of C-shaped inlet manifolds configured to receive the coolant from the tapered inlet distribution chamber, and a number of inverted C-shaped outlet manifolds configured to exhaust the coolant. The C-shaped inlet and inverted C-shaped outlet manifolds are interleaved and are disposed in a circular arrangement. The inverted C-shaped outlet manifolds extend around only a portion of the body and terminate adjacent to opposing sides of the tapered inlet chamber. The body further defines a tapered outlet chamber configured to receive the coolant from the inverted C-shaped outlet manifolds. The C-shaped inlet manifolds extend around only a portion of the body and terminate adjacent to opposing sides of the tapered outlet chamber. Millichannels are formed in the body or in the lid and are configured to receive the coolant from the C-shaped inlet manifolds and to deliver the coolant to the inverted C-shaped outlet manifolds. The millichannels are disposed in a radial arrangement, and the millichannels and the C-shaped inlet and outlet manifolds are further configured to cool one of the upper or lower contact surfaces of the electronic device package.

Yet another aspect of the invention resides in a heat sink for directly cooling at least one electronic device package. The heat sink includes a body formed of at least one thermally conductive material, where the body defines a tapered inlet distribution chamber configured to receive a coolant, a number of C-shaped inlet manifolds configured to receive the coolant from the tapered inlet distribution chamber, and a number of inverted C-shaped outlet manifolds configured to exhaust the coolant. The C-shaped inlet and inverted C-shaped outlet manifolds are interleaved and are disposed in a circular arrangement. The inverted C-shaped outlet manifolds extend around only a portion of the body and terminate adjacent to opposing sides of the tapered inlet chamber. The body further defines a tapered outlet chamber configured to receive the coolant from the inverted C-shaped outlet manifolds. The C-shaped inlet manifolds extend around only a portion of the body and terminate adjacent to opposing sides of the tapered outlet chamber. The body further defines a number of millichannels configured to receive the coolant from the C-shaped inlet manifolds and to deliver the coolant to the inverted C-shaped outlet manifolds. The millichannels are disposed in a radial arrangement, and the millichannels and the C-shaped inlet and inverted C-shaped outlet manifolds are further configured to directly cool one of the upper and lower contact surfaces of the electronic device package.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

A heat sink 60, 70 for cooling at least one electronic device package 20 is described with reference to FIGS. 1-9 and 15. As indicated, for example in FIG. 1, an exemplary electronic device package 20 has an upper contact surface 22 and a lower contact surface 24. For the example arrangements shown in FIGS. 3 and 6, the heat sink 60, 70 comprises a lower lid 12, an upper lid 14 and a body 16 formed of at least one thermally conductive material. The thermally conductive material is selected from the group consisting of copper, aluminum, nickel, molybdenum, titanium, copper alloys, nickel alloys, molybdenum alloys, titanium alloys, aluminum silicon carbide (AlSiC), aluminum graphite and silicon nitride ceramic. For particular configurations, the lower and upper lids 12, 14 and body 16 are formed of the same thermally conductive material(s). However, for other arrangements, different materials may be used.

Figure 3:
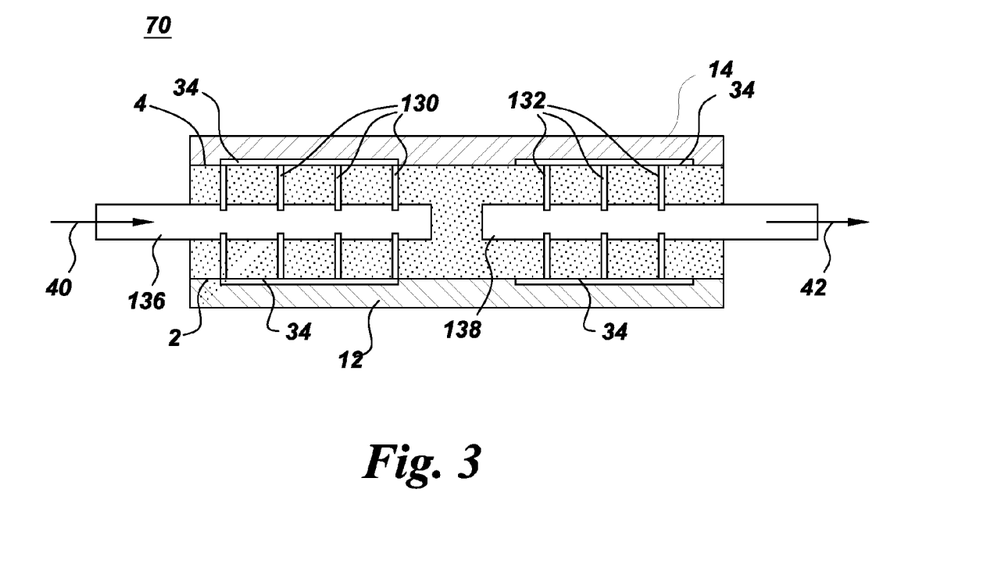
FIG. 3 is a cross-sectional view of a double sided heat sink, with the radial millichannels formed in the lower and upper lids.
Figure 5:
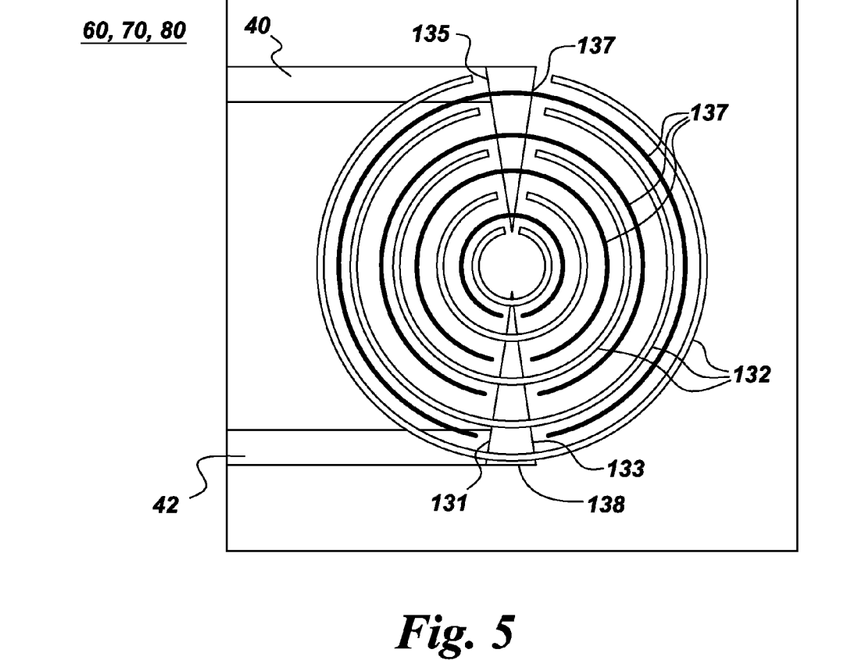
FIG. 5 is a top view of a heat sink body with C-shaped manifolds and wedge-shaped inlet and outlet chambers.
Figure 6:
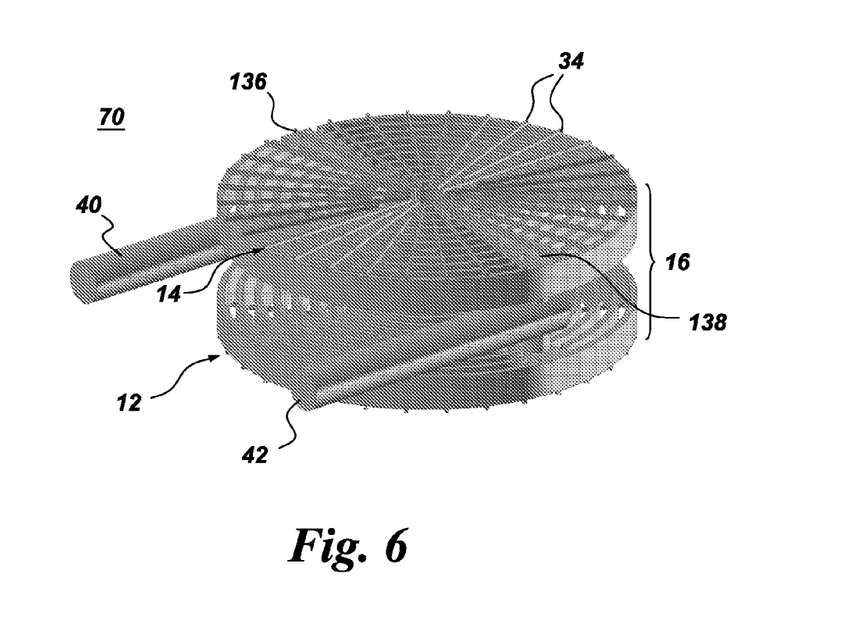
FIG. 6 is an inverse model of a double-sided heat sink with C-shaped manifolds and with radial channels formed in the lids.

For the configurations shown in FIGS. 3 and 6, the body 16 is disposed between and sealed to the lower and upper lids 12, 14. The lids 12, 14 may be welded, brazed or diffusion bonded to the body 16, and conventional welding, brazing or diffusion bonding techniques may be employed. As shown, for example, in FIG. 7, the body 16 defines a tapered inlet distribution chamber 136 configured to receive a coolant. Non-limiting examples of the coolant include de-ionized water and other non-electrically conductive liquids. In addition, for certain applications, the coolant may comprise an electrically conductive liquid. As shown, for example, in FIG. 7, the body 16 further defines a number of C-shaped inlet manifolds 130 configured to receive the coolant from the tapered inlet distribution chamber 136 and a number of inverted C-shaped outlet manifolds 132 configured to exhaust the coolant. The C-shaped inlet and inverted C-shaped outlet manifolds 130, 132 are interleaved (interdigitated) and are disposed in a circular arrangement, also referred to herein as axial. As used herein, the phrases "circular arrangement" and "axial arrangement" should be understood to encompass both curved and straight "circular" passages connecting the radial passages. As shown, for example, in FIG. 5, the inverted C-shaped outlet manifolds 132 extend around only a portion of the body 16 and terminate adjacent to opposing sides 135, 137 of the tapered inlet chamber 136. As shown, for example, in FIG. 7, the body 16 further defines a tapered outlet chamber 138 configured to receive the coolant from the inverted C-shaped outlet manifolds 132. As shown, for example, in FIG. 5, the C-shaped inlet manifolds 130 extend around only a portion of the body 16 and terminate adjacent to opposing sides 131, 133 of the tapered outlet chamber 138.

Figure 7:
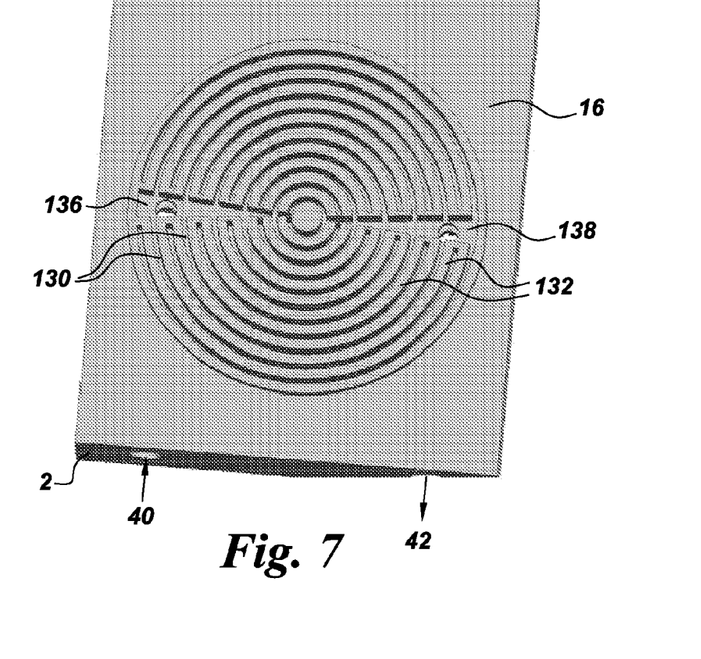
FIG. 7 is a perspective view of a heat sink body with C-shaped manifolds.
Figure 8:
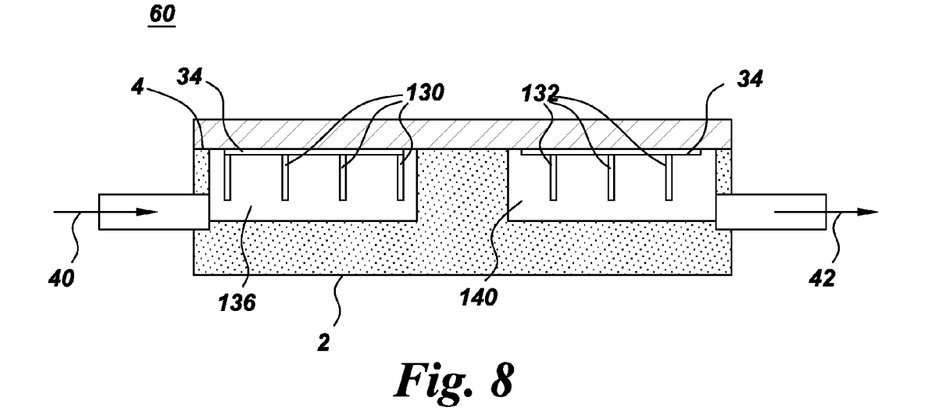
FIG. 8 is a cross-sectional view of a single-sided heat sink, with the radial millichannels formed in the body.
Figure 9:
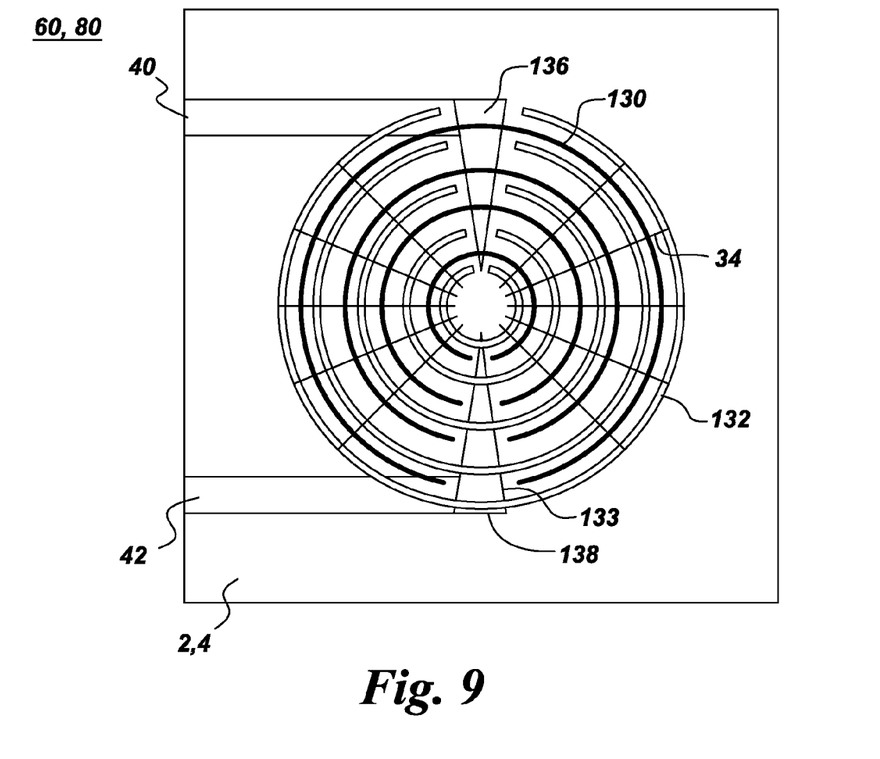
FIG. 9 is a top view of a heat sink body with C-shaped manifolds and wedge-shaped inlet and outlet chambers and with radial millichannels formed in the body.

For the example configurations shown in FIGS. 6, 7, and 9, the tapered inlet chamber 136 and the tapered outlet chamber 138 are wedge-shaped. However, the tapered inlet and outlet chambers 136, 138 may have other shapes as well.

Figure 1:
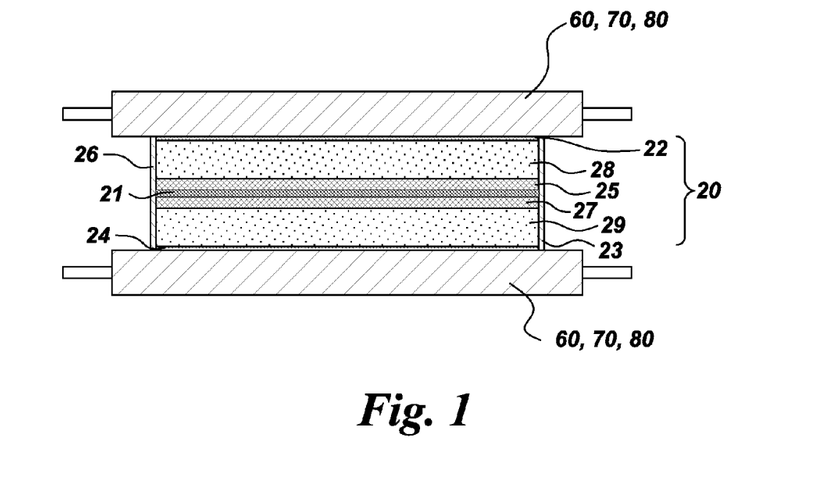
FIG. 1 depicts an electronic device package with upper and lower heatsinks.

Depending on the specific configuration, a number of millichannels 34 are formed in the body 16 and/or are formed in at least one of the lower and upper lids 12, 14 and are configured to receive the coolant from the C-shaped inlet manifolds 130 and to deliver the coolant to the inverted C-shaped outlet manifolds 132. Although not expressly illustrated, the millichannels 34 may be formed in both the body 16 and in one or both of the lids 12, 14, in order to maximize the number of radial channels leading to a further reduction in pressure drop. As shown, for example, in FIGS. 4, 6 and 9, the millichannels 34 are disposed in a radial arrangement. The millichannels 34 and the C-shaped inlet and inverted C-shaped outlet manifolds 132, 134 are further configured to cool one of the upper and lower contact surfaces 22, 24 of the electronic device package 20, as schematically indicated in FIG. 1.

These internal flow structures take coolant from the inlet chamber 136 and distribute it across the entire cooled surface for uniform thermal performance. The coolant passes through the C-shaped manifolds 130, then through the radial millichannels 34 to the set of inverted C-shaped manifolds 132, and back through radial millichannels 34 to the outlet chamber 138. The manifolds and millichannels are machined or cast into the base material. The body 16 and lids 12, 14 can be cast and/or machined. For example, the pieces 12, 14, 16 can be cast and then machined to further define fine features and surface requirements. For this arrangement, the flow passages (manifolds and millichannels) are hermetically sealed by the lids 12, 14. Beneficially, by using the lids and having the heat sink hermetically sealed allows for cooling channels to extend beyond the pole face of the device that is being cooled. This allows for heat spreading effects to be utilised and helps to prevent coolant leakage during disassembly and service.

For particular embodiments, the C-shaped manifolds 130, 132 have relatively larger cross-sectional areas than the millichannels 34. In one non-limiting example, the width of the millichannels was in a range of about 0.5 mm to about 2.0 mm, and the depth of the millichannels was in a range of about 0.5 mm to about 2 mm. In particular, the cross-sectional areas of the channels may be determined to ensure pressure uniformity on the semiconductor. By making the pressure distribution on the semiconductor more uniform, the performance of the semiconductor is not compromised.

Further, it should be noted that the millichannels 34 and C-shaped manifolds 130, 132 could have a variety of cross-sectional shapes, including but not limited to, rounded, circular, trapezoidal, triangular, and square/rectangular cross sections. The passage shape is selected based on the application and manufacturing constraints and affects the applicable manufacturing methods, as well as coolant flow. Beneficially, the incorporation of millichannels 34 into the heat sink 60, 70 significantly increases the surface area of heat conduction from the semiconductor device 20 to the coolant.

In addition, for particular arrangements, at least one of the C-shaped inlet and inverted C-shaped outlet manifolds 130, 132 may have a variable depth. For example, the depth of the C-shaped inlet manifolds 130 may have a maximum value at the tapered inlet chamber 136 and a minimum value at the sides 131, 133 of the tapered outlet chamber 138. Similarly, the depth of the inverted C-shaped outlet manifolds 132 may have a minimum value at the sides 135, 137 of the tapered inlet chamber 136 and a maximum value at the tapered outlet chamber 138. Beneficially, this tapered arrangement achieves a more uniform flow distribution through the cooling circuit.

Figure 4:
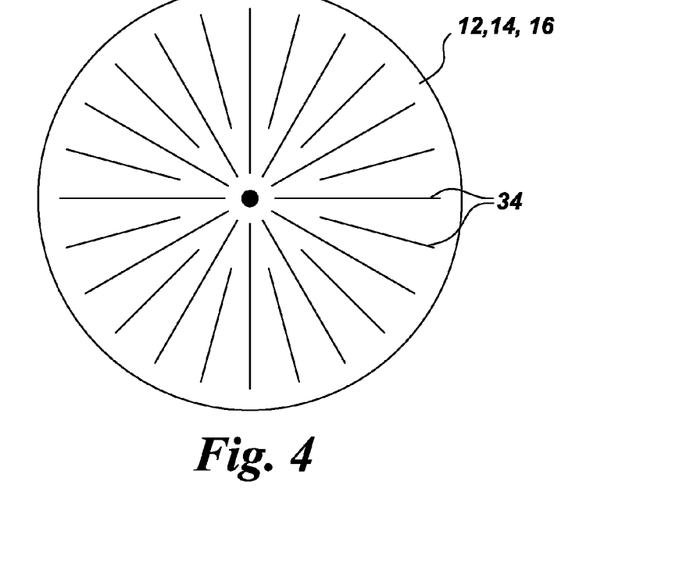
FIG. 4 illustrates a heatsink design, which increases the number of radial channels.

FIG. 4 illustrates a design to increase the number of radial channels to facilitate a reduction in pressure drop with a corresponding improvement in cooling efficiency. More particularly, for the example arrangement shown in FIG. 6, the number of radial millichannels 34 is larger near the circumference of the body 16 relative to the number of radial millichannels 34 near the center of the body 16. This arrangement permits the inclusion of additional radial channels for given spatial and machining constraints.

Figure 15:
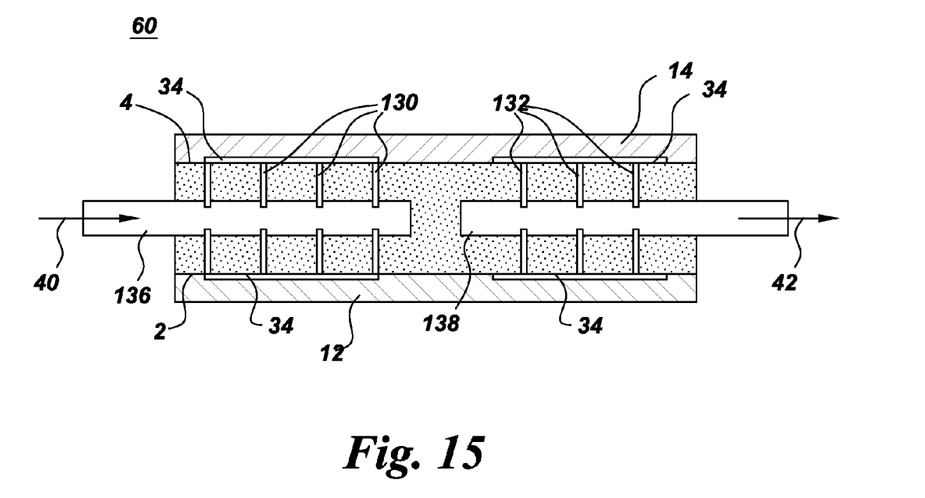
FIG. 15 is a cross-sectional view of a double-sided heat sink, with the radial millichannels formed in the body.

For particular configurations, the heat sink 60, 70 is configured for cooling a number of electronic device packages 20. FIG. 6 illustrates an example double-sided heat sink 70 configuration where the millichannels 34 are formed in the lids 12, 14. FIG. 15 illustrates an example double-sided heat sink 60, where the millichannels 34 are formed in the body. For the example configurations illustrated in FIGS. 8 and 15, the millichannels 34 are formed in the body 16. For the arrangement of FIG. 15, a first subset of the C-shaped inlet manifolds and inverted C-shaped outlet manifolds 130, 132 and the millichannels 34 are formed in the first surface 2 of the body 16, and a second subset of the inlet manifolds and outlet manifolds 130, 132 and the millichannels 34 are formed in the second surface 4 of the body 16, as schematically indicated in FIG. 15. The first subset of the inlet and outlet manifolds 130, 132 and the millichannels 34 is configured to cool an upper contact surface 22 of one of the electronic device packages 20 with the coolant, and the second subset of inlet and outlet manifolds 130, 132 and the millichannels 34 is configured to cool a lower contact surface 24 of another of the electronic device packages 20 with the coolant, as schematically depicted in FIG. 1.

It should be noted that the specific arrangement shown in FIG. 1 is merely illustrative, and any number of electronic device packages 20 and corresponding heat sinks 60, 70 for cooling the electronic device packages may be incorporated into a given stack, depending on the specific application. One of the many benefits of the present invention is its flexibility and modularity for cooling a desired number of device packages.

Similarly, for the double-sided heat sink 70 configuration shown in FIGS. 3 and 6, the millichannels 34 are formed in each of the lower and upper lids 12, 14. As shown, for example, in FIGS. 6 and 7, a second subset of the C-shaped inlet manifolds and inverted C-shaped outlet manifolds 130, 132 is formed in the second surface 4 of the body 16 (see FIG. 7) and a second subset of the millichannels 34 is formed in the upper lid 14 (see FIG. 6). Similar to the arrangement shown in FIG. 7, a first subset of the inlet and outlet manifolds 130, 132 is formed in the first surface 2 of the body 16, and, as indicated in FIG. 6, a first subset of the millichannels 34 is formed in the lower lid 12. As schematically indicated in FIG. 1, the first subsets of the inlet and outlet manifolds 130, 132 and the millichannels 34 are configured to cool an upper contact surface 22 of one of the electronic device packages 20 with the coolant, and the second subsets of inlet and outlet manifolds 130, 132 and the millichannels 34 are configured to cool a lower contact surface 24 of another of the electronic device packages 20 with the coolant.

Figure 12:
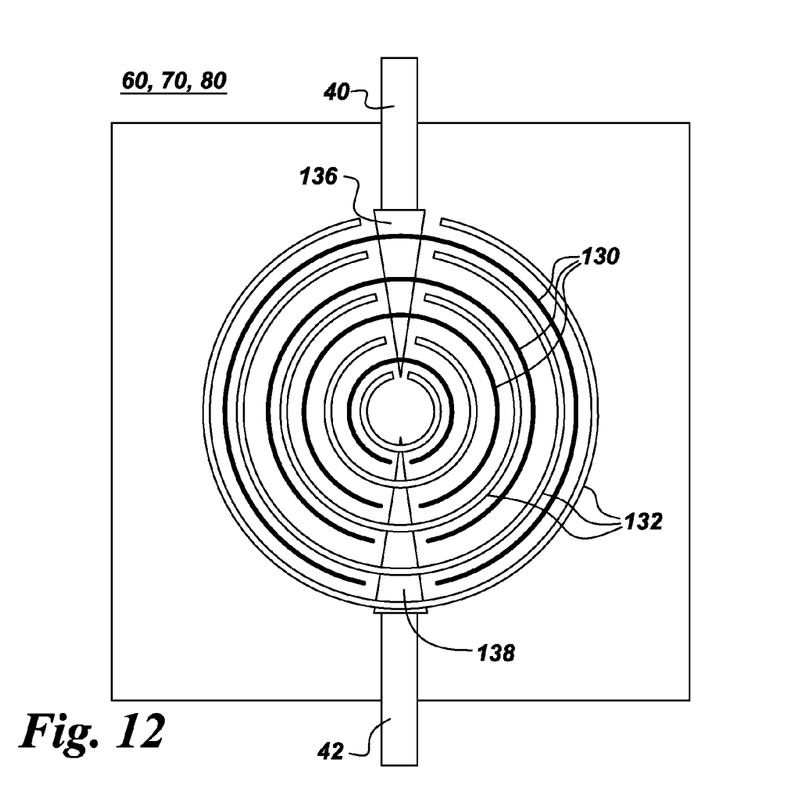
FIG. 12 is a top view of a heat sink body with C-shaped manifolds and wedge-shaped inlet and outlet chambers arranged linearly relative to the respective inlet and outlet plena.

For the arrangement depicted in FIG. 12, the body 16 further defines an inlet plenum 40 configured to supply the coolant to the tapered inlet distribution chamber 136, where the tapered inlet chamber 136 and the inlet plenum 40 are arranged linearly. The body 16 further defines an outlet plenum 42 configured to receive the coolant from the tapered outlet chamber 138, where the tapered outlet chamber 138 and the outlet plenum 42 are arranged linearly. As used here, the term "linearly" should be understood to encompass orientations of the chambers 136, 138 relative to the respective plenum 40, 42 that are within plus or minus ten degrees (+/−10°) of one another.

The invention is not limited to a specific relative orientation of the inlet and outlet chambers 136, 138 and the respective inlet and outlet plena. For example, FIGS. 5 and 6 illustrate a perpendicular configuration for the chambers and the respective plena. For the example configurations shown in FIGS. 5 and 6, the body 16 further defines an inlet plenum 40 configured to supply the coolant to the tapered inlet chamber 136, where the tapered inlet distribution chamber 136 and the inlet plenum 40 are arranged perpendicularly. The body 16 further defines an outlet plenum 42 configured to receive the coolant from the tapered outlet chamber 138, where the tapered outlet chamber 138 and the outlet plenum 42 are arranged perpendicularly. As used here, the term "perpendicularly" should be understood to encompass orientations of the tapered chambers 136, 138 relative to the respective plenum 40, 42 that are within (90°+/−10°) of one another. Beneficially, by placing the coolant inlet plenum 40 and outlet plenum 42 in the same face, the fluid connections are simplified. For example, this configuration may require four holes to be bored for the fluid delivery and removal, two of which are later plugged.

The heat sinks 60, 70 can be single-sided or double-sided. One-sided heat sink configurations 60, 70 for cooling an electronic device package 20 are described with reference to FIGS. 2 and 8. The heat sink 60, 70 comprises a lid 12, 14 formed of at least one thermally conductive material and a body 16 formed of at least one thermally conductive material. The body 16 is sealed to the lid 12, 14, and the construction of the lid and body is described above. As indicated, for example, in FIG. 7, the body 16 defines a tapered inlet distribution chamber 136 configured to receive a coolant, a number of C-shaped inlet manifolds 130 configured to receive the coolant from the tapered inlet distribution chamber 136, and a number of inverted C-shaped outlet manifolds 132 configured to exhaust the coolant. As shown, for example, in FIG. 8, the inlet and outlet manifolds 130, 132 are interleaved (interdigitated) and are disposed in a circular arrangement. As indicated in FIG. 5, the inverted C-shaped outlet manifolds 132 extend around only a portion of the body 16 and terminate adjacent to opposing sides 135, 137 of the tapered inlet chamber 136. As indicated, for example, in FIG. 7, the body 16 further defines a tapered outlet chamber 138 configured to receive the coolant from the inverted C-shaped outlet manifolds 132. As indicated in FIG. 5, the C-shaped inlet manifolds 130 extend around only a portion of the body 16 and terminate adjacent to opposing sides 131, 133 of the tapered outlet chamber 138. For the single-sided arrangements illustrated in FIGS. 2 and 8, millichannels 34 are formed in the body 16 (FIG. 8) or in the lid 12, 14 (FIG. 2) and are configured to receive the coolant from the C-shaped inlet manifolds 130 and to deliver the coolant to the inverted C-shaped outlet manifolds 132. In addition, although not expressly illustrated, the millichannels 34 may be formed in both the body 16 and in the lid 12, 14, in order to maximize the number of radial channels leading to a further reduction in pressure drop. The millichannels 34 are disposed in a radial arrangement, and the millichannels 34 and the inlet and outlet manifolds 132, 134 are further configured to cool one of the upper and lower contact surfaces 22, 24 of the electronic device package 20, as schematically depicted in FIG. 1.

For the example configuration shown in FIG. 9, the millichannels 34 are formed in the body 16. More particularly, the inlet and outlet manifolds 130, 132 and radial millichannels 34 are formed in only one of the first surface 2 or second surface 4 of the body 16 (on the second surface 4 for the case of FIG. 8), such that the heat sink 60 is a single-sided heat sink 60, as shown for example in FIG. 8.

Figure 2:
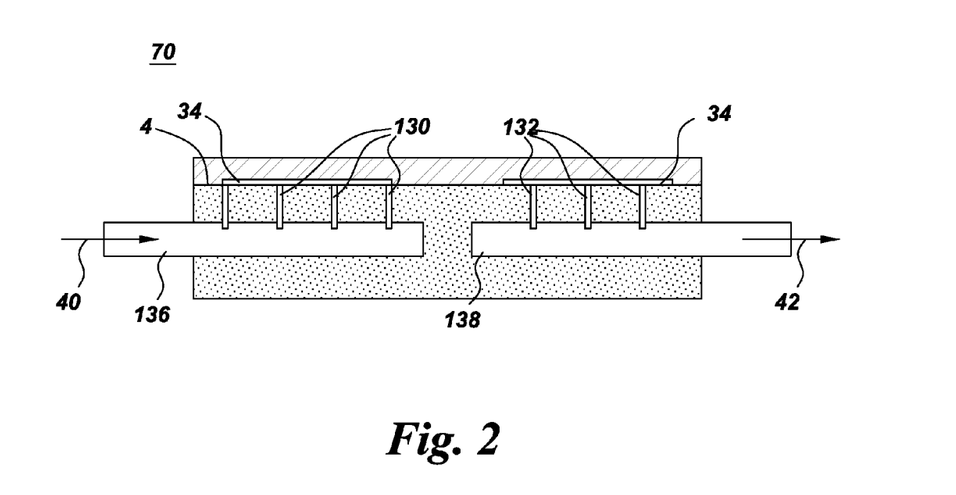
FIG. 2 is a cross-sectional view of a single sided heat sink, with the radial millichannels formed in the upper lid.

For the example configuration shown in FIG. 2, the millichannels 34 are formed in the lid 14. Beneficially, placing radial channels in the lid reduces the thermal resistance by placing the coolant closer to the electronic device package 20. More particularly, the inlet manifolds and outlet manifolds 130, 132 are formed in only one of the first surface 2 or second surface 4 of the body 16 (on the second surface 4 for the case of FIG. 2), such that the heat sink 70 is a single-sided heat sink 70, as shown for example in FIG. 2.

Beneficially, for these arrangements, the cooling delivery/removal system is arranged such that machining on less sides is required. Holes are bored from one face to the midpoint of the material. Then, holes are bored down from the main surface to meet the other holes. Through a milling process, the wedge-shaped chambers (which may also be rectangular) are cut, which intersect with C-shaped and inverted C-shaped manifolds, which alternate as left-facing or right-facing, such that every other one connects to the inlet chamber and the rest to the outlet chamber. Then, radial millichannels may be cut into either the main body or the lids, and all pieces are attached through brazing, welding, or other methods, such as diffusion bonding. Thus, these implementations reduce the manufacturing costs by requiring manufacturing on only three surfaces (for cooling, an additional surface for electrical connections).

For the exemplary embodiments described above with reference to FIGS. 1-9 and 15, the upper contact surface 22 and lower contact surface 24 can be circular in cross-section, and the body 16 can be cylindrical (i.e., a disk or hockey-puck arrangement). However, other geometries can be employed, including without limitation, square and rectangular cross-sections. For the example arrangement depicted in FIG. 1, the electronic device package 20 is a press-package 20. Although the invention is not limited to any specific device structure, the following example press-package configuration is provided for illustrative purposes. In the example, the press-package 20 comprises at least one semiconductor device 21 formed on a wafer 23, upper and lower coefficient of thermal-expansion (CTE) matched plates 25, 27, and upper and lower electrodes 28, 29. The wafer 23 is disposed between the CTE plates 25, 27, the upper electrode 28 is disposed above the upper CTE plate 25, and the lower CTE plate 27 is disposed above the lower electrode 29, as shown for example in FIG. 1. For the press-package embodiment, each of the wafer 23, CTE plates 25, 27 and electrodes 28, 29 may have a circular cross-section. Non-limiting examples of semiconductor devices include IGCTs, GTOs and IGBTs. The present invention finds application to semiconductor devices manufactured from a variety of semiconductors, non-limiting examples of which include silicon (Si), silicon carbide (SiC), gallium nitride (GaN), and gallium arsenide (GaAs). The press-package typically includes an insulating (for example, ceramic) housing 26, as indicated for example in FIG. 1. Although FIG. 1 shows the heat sinks 60, 70 as extending outside the housing 26, in other embodiments, the bodies 16 of the heat sinks 60, 70 are disposed within the housing 26. Moreover, electrodes 28, 29 can extend vertically beyond the bounds of housing 26, for example with a compliant seal disposed between the outer circumference of electrodes 28 (and 29) and the housing 26. In addition, the heat sinks 60, 70 can extend out of the housing (as shown) to enable electrical connections and for placing other devices that need to be cooled. Therefore, the body 16 can have a larger diameter than housing 26.

Beneficially, by forming a hermetic seal, the heat sinks 60, 70 prevent the coolant from leaking onto the electronics during assembly, disassembly, or servicing. In addition, the heat sinks 60, 70 provide high-performance cooling, in a uniform manner across the pole face of the electronic device package 20.

In addition to the configurations described above, a lidless configuration may be employed for direct cooling. Accordingly, another heat sink 80 configuration is described with reference to FIGS. 5, 7 and 9-14. As shown for example, in FIG. 1, a heat sink 80 is provided, for cooling at least one electronic device package 20. As indicated in FIG. 1, the electronic device package has upper and lower contact surfaces 22, 24. As indicated, for example, in FIG. 10, the heat sink 80 comprises a body 16 formed of at least one thermally conductive material. As shown in FIG. 7, the body 16 defines a tapered inlet distribution chamber 136 configured to receive a coolant, C-shaped inlet manifolds 130 configured to receive the coolant from the tapered inlet distribution chamber 136, inverted C-shaped outlet manifolds 132 configured to exhaust the coolant. As shown, for example, in FIG. 5, the inlet and outlet manifolds 130, 132 are interleaved (interdigitated) and are disposed in a circular (axial) arrangement. As also indicated in FIG. 6, the inverted C-shaped outlet manifolds 132 extend around only a portion of the body 16 and terminate adjacent to opposing sides 135, 137 of the tapered inlet chamber 136. As shown in FIG. 7, the body 16 further defines a tapered outlet chamber 138 configured to receive the coolant from the outlet manifolds 132. As shown, for example, in FIG. 5, the C-shaped inlet manifolds 130 extend around only a portion of the body 16 and terminate adjacent to opposing sides 131, 133 of the tapered outlet chamber 138. For the illustrated examples, the tapered inlet and outlet chambers 136, 138 are wedge-shaped. However, the tapered chambers 136, 138 may have other shapes.

Figure 11:
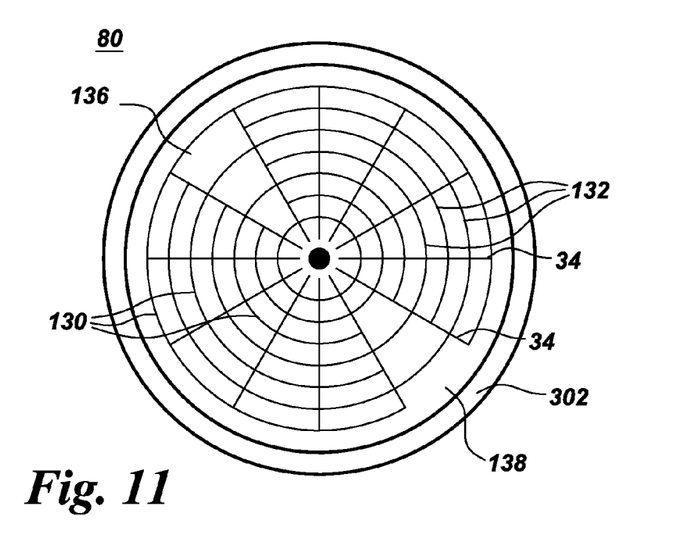
FIG. 11 illustrates a sealing arrangement for the double-sided heatsink of FIG. 13.

As indicated, for example, in FIGS. 9 and 11, the body 16 further defines millichannels 34 configured to receive the coolant from the C-shaped inlet manifolds 130 and to deliver the coolant to the outlet manifolds 132. The millichannels 34 are disposed in a radial arrangement, and the millichannels 34 and the inlet and outlet manifolds 132, 134 are further configured to directly cool one of the upper and lower contact surfaces 22, 24 of the electronic device package 20, as schematically indicated in FIG. 1. Example dimensions and cross-sections for the manifolds 130, 132 and millichannels 34 are presented above. In addition, and as discussed above, at least one of the inlet and outlet manifolds 130, 132 may have a variable depth. Beneficially, such a tapered arrangement achieves a more uniform flow distribution through the cooling circuit.

Beneficially, by incorporating the millichannels and inlet/outlet manifolds into the body 16, the assembly process is simplified. In particular, this single-piece configuration eliminates the need to bond two components.

For the example configuration shown in FIG. 4, the number of radial millichannels 34 is larger near the circumference of the body 16 relative to the number of radial millichannels 34 near the center of the body 16. As noted above, the arrangement shown in FIG. 4 provides enhanced cooling by permitting the inclusion of additional radial channels for given spatial and machining constraints. Although this arrangement is not expressly shown for the lidless configuration of FIGS. 10 and 11, it is shown for the case of C-shaped manifolds in FIG. 6.

Figure 10:
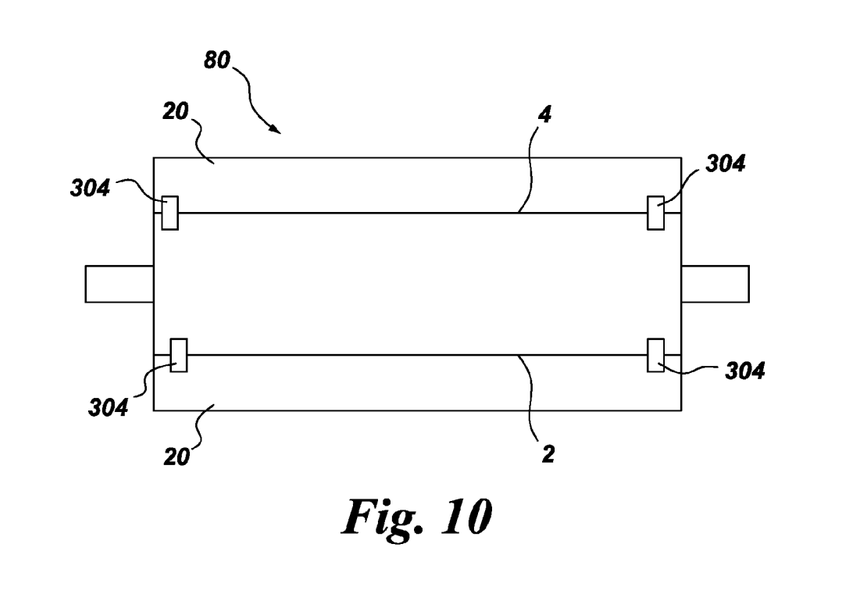
FIG. 10 illustrates a heatsink configuration that does not include lids.

For the example arrangement shown in FIGS. 10 and 11, the body 16 further defines a groove 302 for receiving a gasket 304. For particular arrangements, the gasket 304 comprises an O-ring. Beneficially, this assembly process is relatively simple and robust, requiring few manufacturing steps and eliminating the need for more complex assembly techniques, such as soldering or other metal bonding techniques.

For the example arrangement shown in FIG. 12, the body 16 further defines an inlet plenum 40 configured to supply the coolant to the tapered inlet distribution chamber 136 and an outlet plenum 42 configured to receive the coolant from the tapered outlet chamber 138. The tapered inlet chamber 136 and the inlet plenum 40 may be arranged linearly, and the tapered outlet chamber 138 and the outlet plenum 42 may be arranged linearly, as shown, for example in FIG. 12. For other configurations, the tapered inlet chamber 136 and the inlet plenum 40 may be arranged perpendicularly, and the tapered outlet chamber 138 and the outlet plenum 42 may be arranged perpendicularly, as shown in FIG. 9.

Figure 13:
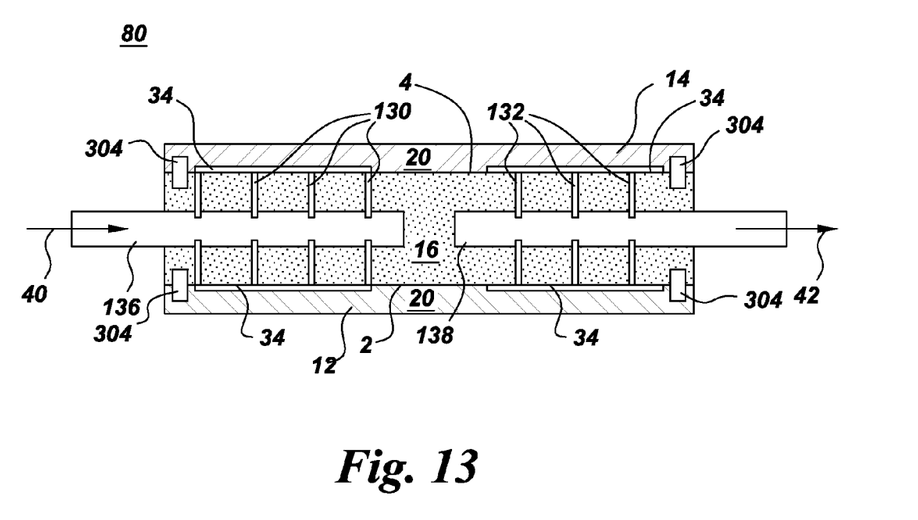
FIG. 13 illustrates a double-sided heat sink configuration that does not include lids.
Figure 14:
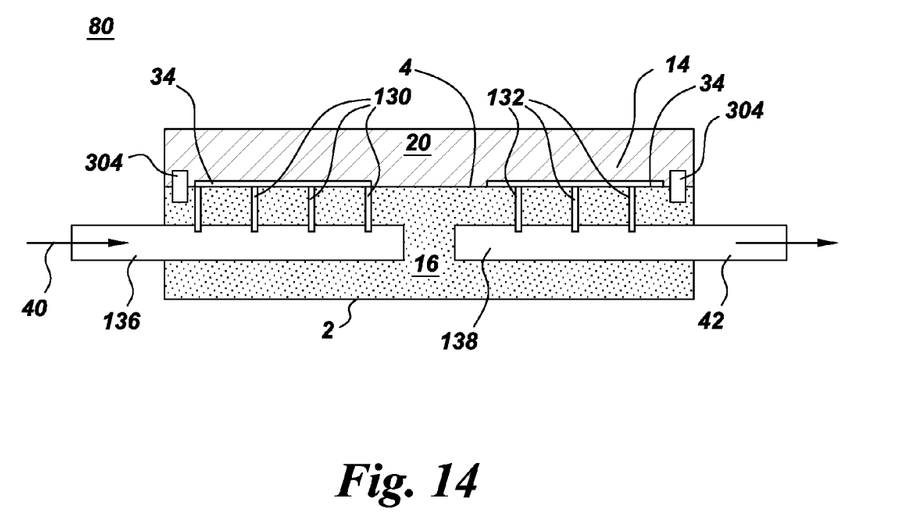
FIG. 14 illustrates a single-sided heat sink configuration that does not include lids.

For particular configurations, the heat sink 80 is configured for cooling a number of electronic device packages 20. FIGS. 10 and 13 schematically illustrate an example double-sided heat sink 80 configuration. For this arrangement, a first subset of inlet and outlet manifolds 130, 132 and the millichannels 34 are formed in the first surface 2 of the body 16, and a second subset of inlet and outlet manifolds 130, 132 and millichannels 34 are formed in the second surface 4 of the body 16, as indicated in FIG. 13. The first subset of the manifolds 130, 132 and millichannels 34 is configured to directly cool an upper contact surface 22 (FIG. 1) of one of the electronic device packages 20 with the coolant, and the second subset of manifolds 130, 132 and millichannels 34 is configured to directly cool a lower contact surface 24 (FIG. 1) of another of the electronic device packages 20 with the coolant, as indicated in FIG. 13.

For other configurations, the heat sink 80 is configured as a single sided heat sink. For the example arrangement shown in FIG. 14, the inlet and outlet manifolds 130, 132 are formed in only one of the first surface 2 or second surface 4 of the body 16 (on the second surface 4 for the case of FIG. 14), such that the heat sink 80 is a single-sided heat sink 80.

Beneficially, heat sink 80 provides enhanced heat transfer relative to conventional cooling of power devices, with a robust and simple sealing arrangement. For example, the heat sinks 80 can be sealed to adjacent device packages 20 using relatively simple O-ring assemblies. Heat sink 80 is integral to the press-package, directly cooling the power devices with direct contact by the coolant, thereby enhancing the heat transfer. In addition, heat sink 80 reduces the risk of leaking or fatigue failure and cost by reducing the number of brazes (or other means of mechanical attachment) required to contain the coolant. Further, the interleaved C-shaped inlet and outlet channels deliver coolant uniformly to the surface of the device being cooled, and the millichannels increase the surface area of heat conduction from the power device to the coolant in this integral heat sink. Moreover, incorporating the millichannels and inlet/outlet manifolds into the body 16 simplifies the assembly process.

By providing higher reliability and a larger operating margin due to improved thermal performance, the heat sinks 60, 70, 80 are particularly desirable for applications demanding very high reliability, such as oil and gas liquefied natural gas (LNG) and pipeline drives, oil and gas sub-sea transmission and distribution, and drives. In addition, the heat sinks 60, 70, 80 can be employed in a variety of applications, non-limiting examples of which include high power applications, such as metal rolling mills, paper mills and traction.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A heat sink for cooling at least one electronic device package, the electronic device package having an upper contact surface and a lower contact surface, the heat sink comprising:
   a lower lid formed of at least one thermally conductive material
   an upper lid formed of at least one thermally conductive material; and
   a body formed of at least one thermally conductive material, wherein the body is disposed between and sealed to the lower and upper lids, and wherein the body defines:
      a tapered inlet distribution chamber configured to receive a coolant,
      a plurality of C-shaped inlet manifolds configured to receive the coolant from the tapered inlet distribution chamber,
      a plurality of inverted C-shaped outlet manifolds configured to exhaust the coolant, wherein the C-shaped inlet and inverted C-shaped outlet manifolds are interleaved and are disposed in a circular arrangement, and wherein the inverted C-shaped outlet manifolds extend around only a portion of the body and terminate adjacent to opposing sides of the tapered inlet chamber, and
      a tapered outlet chamber configured to receive the coolant from the inverted C-shaped outlet manifolds, wherein the C-shaped inlet manifolds extend around only a portion of the body and terminate adjacent to opposing sides of the tapered outlet chamber, and
   wherein a plurality of millichannels are formed in one or both of (a) the body and (b) at least one of the lower and upper lids and are configured to receive the coolant from the C-shaped inlet manifolds and to deliver the coolant to the inverted C-shaped outlet manifolds, wherein the millichannels are disposed in a radial arrangement, and wherein the millichannels and the C-shaped inlet and inverted C-shaped outlet manifolds are further configured to cool one of the upper and lower contact surfaces of the electronic device package.

2. The heat sink of claim 1, wherein the millichannels are formed in the body.

3. The heat sink of claim 2, wherein the millichannels are also formed in at least one of the lower and upper lids.

4. The heat sink of claim 2 for cooling a plurality of electronic device packages, wherein the body has a first surface and a second surface, wherein a first subset of the C-shaped inlet manifolds and inverted C-shaped outlet manifolds and the millichannels are formed in the first surface of the body, wherein a second subset of the C-shaped inlet manifolds and inverted C-shaped outlet manifolds and the millichannels are formed in the second surface of the body, wherein the first subset of the C-shaped inlet and inverted C-shaped outlet manifolds and the millichannels is configured to cool an upper contact surface of one of the electronic device packages with the coolant, and wherein the second subset of C-shaped inlet and inverted C-shaped outlet manifolds and the millichannels is configured to cool a lower contact surface of another of the electronic device packages with the coolant.

5. The heat sink of claim 1, wherein the millichannels are formed in each of the lower and upper lids.

6. The heat sink of claim 5 for cooling a plurality of electronic device packages, wherein the body has a first surface and a second surface, wherein a first subset of the C-shaped inlet manifolds and inverted C-shaped outlet manifolds is formed in the first surface of the body and a first subset of the millichannels is formed in the lower lid, wherein a second subset of the C-shaped inlet manifolds and inverted C-shaped outlet manifolds is formed in the second surface of the body and a second subset of the millichannels is formed in the upper lid, wherein the first subsets of the C-shaped inlet and inverted C-shaped outlet manifolds and the millichannels are configured to cool an upper contact surface of one of the electronic device packages with the coolant, and wherein the second subset of C-shaped inlet and inverted C-shaped outlet manifolds and the millichannels are configured to cool a lower contact surface of another of the electronic device packages with the coolant.

7. The heat sink of claim 1, wherein the tapered inlet distribution chamber and the tapered outlet chamber are wedge-shaped.

8. The heat sink of claim 1, wherein a cross-section of the millichannels and a cross-section of the C-shaped inlet and inverted C-shaped outlet manifolds are selected from the group consisting of rounded, circular, trapezoidal, triangular, and rectangular cross sections.

9. The heat sink of claim 1, wherein a number of radial millichannels is larger near a circumference of the body or lids relative to a number of radial millichannels near a center of the body or lids.

10. The heat sink of claim 1, wherein the body further defines:
an inlet plenum configured to supply the coolant to the tapered inlet distribution chamber, wherein the tapered inlet chamber and the inlet plenum are arranged linearly; and
an outlet plenum configured to receive the coolant from the tapered outlet chamber, wherein the tapered outlet chamber and the outlet plenum are arranged linearly.

11. The heat sink of claim 1, wherein the body further defines:
an inlet plenum configured to supply the coolant to the tapered inlet distribution chamber, wherein the tapered inlet chamber and the inlet plenum are arranged perpendicularly; and
an outlet plenum configured to receive the coolant from the tapered outlet chamber, wherein the tapered outlet chamber and the outlet plenum are arranged perpendicularly.

12. The heat sink of claim 1, wherein at least one of the C-shaped inlet and inverted C-shaped outlet manifolds have a variable depth.

13. A heat sink for cooling an electronic device package, the electronic device package having an upper contact surface and a lower contact surface, the heat sink comprising:
a lid formed of at least one thermally conductive material; and
a body formed of at least one thermally conductive material, wherein the body is sealed to the lid, and wherein the body defines:
a tapered inlet distribution chamber configured to receive a coolant,
a plurality of C-shaped inlet manifolds configured to receive the coolant from the tapered inlet distribution chamber,
a plurality of inverted C-shaped outlet manifolds configured to exhaust the coolant, wherein the C-shaped inlet and inverted C-shaped outlet manifolds are interleaved and are disposed in a circular arrangement, and wherein the inverted C-shaped outlet manifolds extend around only a portion of the body and terminate adjacent to opposing sides of the tapered inlet chamber, and
a tapered outlet chamber configured to receive the coolant from the inverted C-shaped outlet manifolds, wherein the C-shaped inlet manifolds extend around only a portion of the body and terminate adjacent to opposing sides of the tapered outlet chamber, and
wherein a plurality of millichannels are formed in one or both of the body and the lid are configured to receive the coolant from the C-shaped inlet manifolds and to deliver the coolant to the inverted C-shaped outlet manifolds, wherein the millichannels are disposed in a radial arrangement, and wherein the millichannels and the C-shaped inlet and outlet manifolds are further configured to cool one of the upper or lower contact surfaces of the electronic device package.

14. The heat sink of claim 13, wherein the millichannels are formed in the body, wherein the body has a first surface and a second surface, and wherein the C-shaped inlet and inverted C-shaped outlet manifolds and radial millichannels are formed in only one of the first surface or second surface of the body, which surface is adjacent the lid, such that the heat sink is a single-sided heat sink.

15. The heat sink of claim 14, wherein the millichannels are also formed in the lid.

16. The heat sink of claim 13, wherein the millichannels are formed in the lid, wherein the body has a first surface and a second surface, and wherein the C-shaped inlet manifolds and inverted C-shaped outlet manifolds are formed in only one of the first surface or second surface of the body, which surface is adjacent the lid, such that the heat sink is a single-sided heat sink.

17. A heat sink for directly cooling at least one electronic device package, the electronic device package having an upper contact surface and a lower contact surface, the heat sink comprising:
a body formed of at least one thermally conductive material, wherein the body defines:
a tapered inlet distribution chamber configured to receive a coolant,
a plurality of C-shaped inlet manifolds configured to receive the coolant from the tapered inlet distribution chamber,
a plurality of inverted C-shaped outlet manifolds configured to exhaust the coolant, wherein the C-shaped inlet and inverted C-shaped outlet manifolds are interleaved and are disposed in a circular arrangement, and wherein the inverted C-shaped outlet manifolds extend around only a portion of the body and terminate adjacent to opposing sides of the tapered inlet chamber,
a tapered outlet chamber configured to receive the coolant from the inverted C-shaped outlet manifolds, wherein the C-shaped inlet manifolds extend around only a portion of the body and terminate adjacent to opposing sides of the tapered outlet chamber, and a plurality of millichannels configured to receive the coolant from the C-shaped inlet manifolds and to deliver the coolant to the inverted C-shaped outlet manifolds, wherein the millichannels are disposed in a radial arrangement, and wherein the millichannels and the C-shaped inlet and inverted C-shaped outlet manifolds are further configured to directly cool one of the upper and lower contact surfaces of the electronic device package.

18. The heat sink of claim 17, wherein the body further defines a groove for receiving a gasket.

19. The heat sink of claim 18, wherein the gasket comprises an O-ring.

20. The heat sink of claim 17, wherein the tapered inlet distribution chamber and the tapered outlet chamber are wedge-shaped.

21. The heat sink of claim 17, wherein a cross-section of the millichannels and a cross-section of the inlet and outlet manifolds are selected from the group consisting of rounded, circular, trapezoidal, triangular, and rectangular cross sections.

22. The heat sink of claim 17, wherein a number of radial millichannels is larger near a circumference of the body relative to a number of radial millichannels near a center of the body.

23. The heat sink of claim 17, wherein the body further defines:

an inlet plenum configured to supply the coolant to the tapered inlet distribution chamber, wherein the inlet distribution chamber and the inlet plenum are arranged linearly; and an outlet plenum configured to receive the coolant from the tapered outlet chamber, wherein the outlet chamber and the outlet plenum are arranged linearly.

24. The heat sink of claim 17, wherein the body further defines:

an inlet plenum configured to supply the coolant to the tapered inlet distribution chamber, wherein the inlet distribution chamber and the inlet plenum are arranged perpendicularly; and an outlet plenum configured to receive the coolant from the tapered outlet chamber, wherein the outlet chamber and the outlet plenum are arranged perpendicularly.

25. The heat sink of claim 17, wherein at least one of the inlet and outlet manifolds have a variable depth.

26. The heat sink of claim 17 for directly cooling a plurality of electronic device packages, wherein the body has a first surface and a second surface, wherein a first subset of the inlet and outlet manifolds and the millichannels are formed in the first surface of the body, wherein a second subset of the inlet and outlet manifolds and millichannels are formed in the second surface of the body, wherein the first subset of the inlet and outlet manifolds and millichannels is configured to directly cool an upper contact surface of one of the electronic device packages with the coolant, and wherein the second subset of inlet and outlet manifolds and millichannels is configured to directly cool a lower contact surface of another of the electronic device packages with the coolant.

27. The heat sink of claim 17, wherein the body has a first surface and a second surface, and wherein the C-shaped inlet manifolds and inverted C-shaped outlet manifolds are formed in only one of the first surface or second surface of the body, such that the heat sink is a single-sided heat sink.

* * * * *